(12) United States Patent
Chu et al.

(10) Patent No.: US 11,632,084 B2
(45) Date of Patent: Apr. 18, 2023

(54) AMPLIFIER WITH A CONTROLLABLE PULL-DOWN CAPABILITY FOR A MEMORY DEVICE

(71) Applicant: Micron Technology, Inc., Boise, ID (US)

(72) Inventors: Wei Lu Chu, Shanghai (CN); Zhi Qi Huang, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 124 days.

(21) Appl. No.: 17/127,172

(22) Filed: Dec. 18, 2020

(65) Prior Publication Data
US 2022/0200538 A1 Jun. 23, 2022

(51) Int. Cl.
*H03F 3/45* (2006.01)
*H03F 1/30* (2006.01)
*G11C 7/06* (2006.01)
*H03F 1/02* (2006.01)

(52) U.S. Cl.
CPC .............. *H03F 1/308* (2013.01); *G11C 7/062* (2013.01); *H03F 1/0222* (2013.01); *H03F 2200/78* (2013.01)

(58) Field of Classification Search
CPC .... H03F 1/308; H03F 1/0222; H03F 2200/78; H03F 3/45183; H03F 3/45179; H03F 3/45192; H03F 3/45089; H03F 3/3022; H03F 3/45085; H03F 3/45071; H03F 1/02; H03F 1/30; G11C 7/062
See application file for complete search history.

(56) References Cited

U.S. PATENT DOCUMENTS

| | | | | |
|---|---|---|---|---|
| 9,660,585 | B2 * | 5/2017 | Mittal | H03F 1/0205 |
| 10,897,229 | B1 * | 1/2021 | Zhang | H03F 3/45273 |
| 2017/0331476 | A1 * | 11/2017 | Cho | G11C 29/025 |
| 2022/0076715 | A1 * | 3/2022 | Lee | G11C 7/1051 |
| 2022/0148630 | A1 * | 5/2022 | Kavala | G11C 7/1048 |

* cited by examiner

*Primary Examiner* — Khanh V Nguyen
(74) *Attorney, Agent, or Firm* — Holland & Hart, LLP

(57) ABSTRACT

Methods, systems, and devices for operating an amplifier with a controllable pull-down capability are described. A memory device may include a memory array and a power circuit that generates an internal signal for components in the memory array. The power circuit may include an amplifier and a power transistor that is coupled with the amplifier. A pull-down capability of the amplifier may be controllable using an external signal that is based on a difference between a reference signal and the internal signal. The power circuit may also include a comparator that is coupled with the amplifier and configured to compare the reference signal and the internal signal. Components of the comparator may be integrated with components of the amplifier, may share a bias circuit, and may use nodes within the amplifier to control the comparator. A signal output by the comparator may control the pull-down capability of the amplifier.

20 Claims, 7 Drawing Sheets

AMPLIFIER WITH A CONTROLLABLE PULL-DOWN CAPABILITY FOR A MEMORY DEVICE

FIELD OF TECHNOLOGY

The following relates generally to one or more systems for memory and more specifically to operating an amplifier with a controllable pull-down capability.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
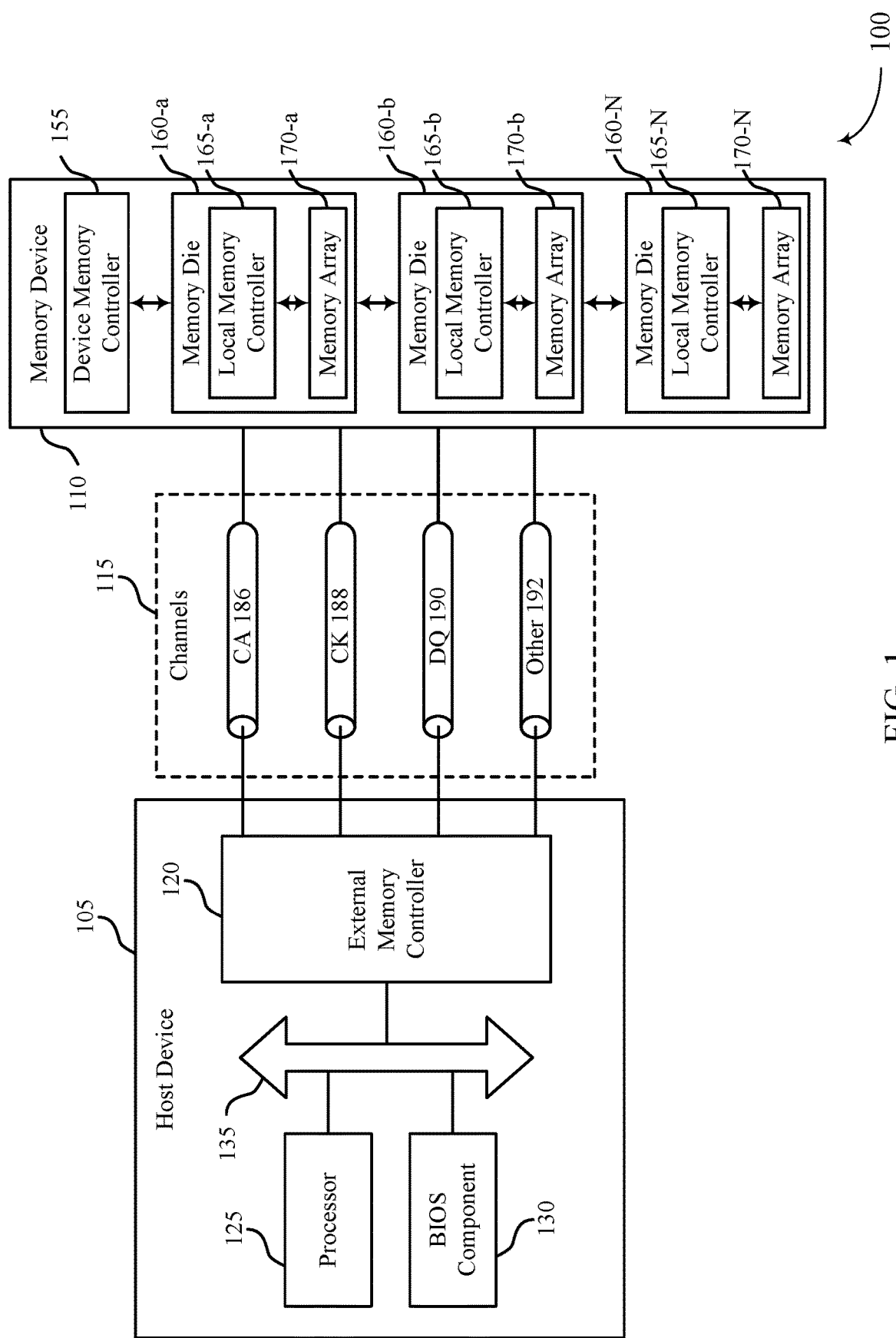
FIG. 1 illustrates an example of a system that supports operating an amplifier with a controllable pull-down capability in accordance with examples as disclosed herein.

A memory device may include a power circuit that generates an internal signal (e.g., a power signal) having a voltage for operating components within the memory device. The power circuit (e.g., a voltage regulator) may include an amplifier and a power transistor that are arranged in a voltage-follower configuration. In some examples, the amplifier includes a pull-up circuit and a pull-down circuit that are configured to drive an output of the amplifier between a first voltage (e.g., a high voltage) and a second voltage (e.g., a low voltage) based on a voltage difference between a reference signal and the internal signal. In some examples, a voltage of the internal signal may be pulled below a desired operating voltage (e.g., during a loading event), and the output of the amplifier may turn on the power transistor to apply current to the output of the power circuit to return the voltage of the internal signal to the desired operating voltage. To decrease the voltage drop in the internal signal and a duration associated with returning the voltage of the internal signal to the desired operating voltage, the pull-up/down capabilities of the amplifier may be strengthened—e.g., so that the output of the amplifier may more quickly transition between the high and low voltages.

Increasing a strength of a pull-up/down functionality of an amplifier, however, may increase an amount of power consumed by the amplifier. That is, if the strength of the pull-up/pull-down functionality is increased, the current used by the pull-up and pull-down circuits may increase, and the average current used by the amplifier during operation may increase. Additionally, modifying the transistors and/or adding transistors to an amplifier to increase the strength of the pull-up/down functionality of the amplifier may change a frequency response of the amplifier.

To enhance a performance of an amplifier in a power circuit with minimal (or no) increase in the average power consumed by the amplifier, a power circuit may include an amplifier that is configured so that a pull-down capability of the amplifier is controllable (e.g., may be boosted). In some examples, a memory device may include a memory array and a power circuit that provides an internal signal to one or more components of the memory array. The power circuit may include an amplifier that outputs, based on a difference between a first input signal and a second input signal, a control signal for generating the internal signal. Also, a pull-down capability of the amplifier may be controlled based on the difference between the first input signal and the second input signal. In some examples, a comparator is used to detect the difference between the first input signal and the second input signal and to control the pull-down capability of the amplifier. In some examples, the comparator is integrated into the amplifier.

By controlling the pull-down capability of the amplifier, a response (e.g., the time response) of the power circuit to loading events may be improved with minimal effect to the average power consumption and/or frequency response of the amplifier—relative to permanently strengthening the pull-down capability of the amplifier to improve the response of the power circuit. By integrating the comparator into the amplifier, an amount of current used to operate the amplifier may be reduced relative to having a separate comparator and amplifier—e.g., because the comparator and amplifier may share a bias current and circuits for generating reference currents—and a footprint of the amplifier may be smaller than a combined footprint of a separate amplifier and comparator. Additionally, integrating the comparator into the amplifier may reduce the latency between detecting a triggering condition and activating or deactivating the pull-up circuit or pull-down circuit.

Features of the disclosure are initially described in the context of systems and dies. Features of the disclosure are also described in the context of power circuits and signal diagrams. These and other features of the disclosure are further illustrated by and described with reference to an apparatus diagram and a flowchart that relate to operating an amplifier with a controllable pull-down capability.

FIG. 1 illustrates an example of a system 100 that supports operating an amplifier with a controllable pull-down capability in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device 110 may include a power circuit that provides an internal signal to one or more components in the memory device 110. An internal signal may be an example of any voltage on any conductive line that is used to power one or more components in the memory device 110. Examples of internal signals may include Vcc, Vss, Vccq, Vdd, or any other voltage rail or voltage on a conductive line. To enhance a performance of an amplifier in a power circuit with minimal (or no) increase in the average power consumed by the amplifier, a power circuit may include an amplifier that is configured so that a pull-down capability of the amplifier is controllable (e.g., may be boosted). In some examples, a memory device may include a memory array and a power circuit that provides an internal signal to one or more components of the memory array. The power circuit may include an amplifier that outputs, based on a difference between a first input signal and a second input signal, a control signal for generating the internal signal. Also, a pull-down capability of the amplifier may be controlled based on the difference between the first input signal and the second input signal. In some examples, a comparator is used to detect the difference between the first input signal and the second input signal and to control the pull-down capability of the amplifier. In some examples, the comparator is integrated into the amplifier.

By controlling the pull-down capability of the amplifier, a response of the power circuit to loading events may be improved with minimal effect to the average power consumption and/or frequency response of the amplifier—relative to permanently strengthening the pull-down capability of the amplifier to improve the response of the power circuit. By integrating the comparator into the amplifier, an amount of current used to operate the amplifier may be reduced relative to having a separate comparator and amplifier—e.g., because the comparator and amplifier may share a bias current and circuits for generating reference currents—and a footprint of the amplifier may be smaller than a combined footprint of a separate amplifier and comparator.

Figure 2:
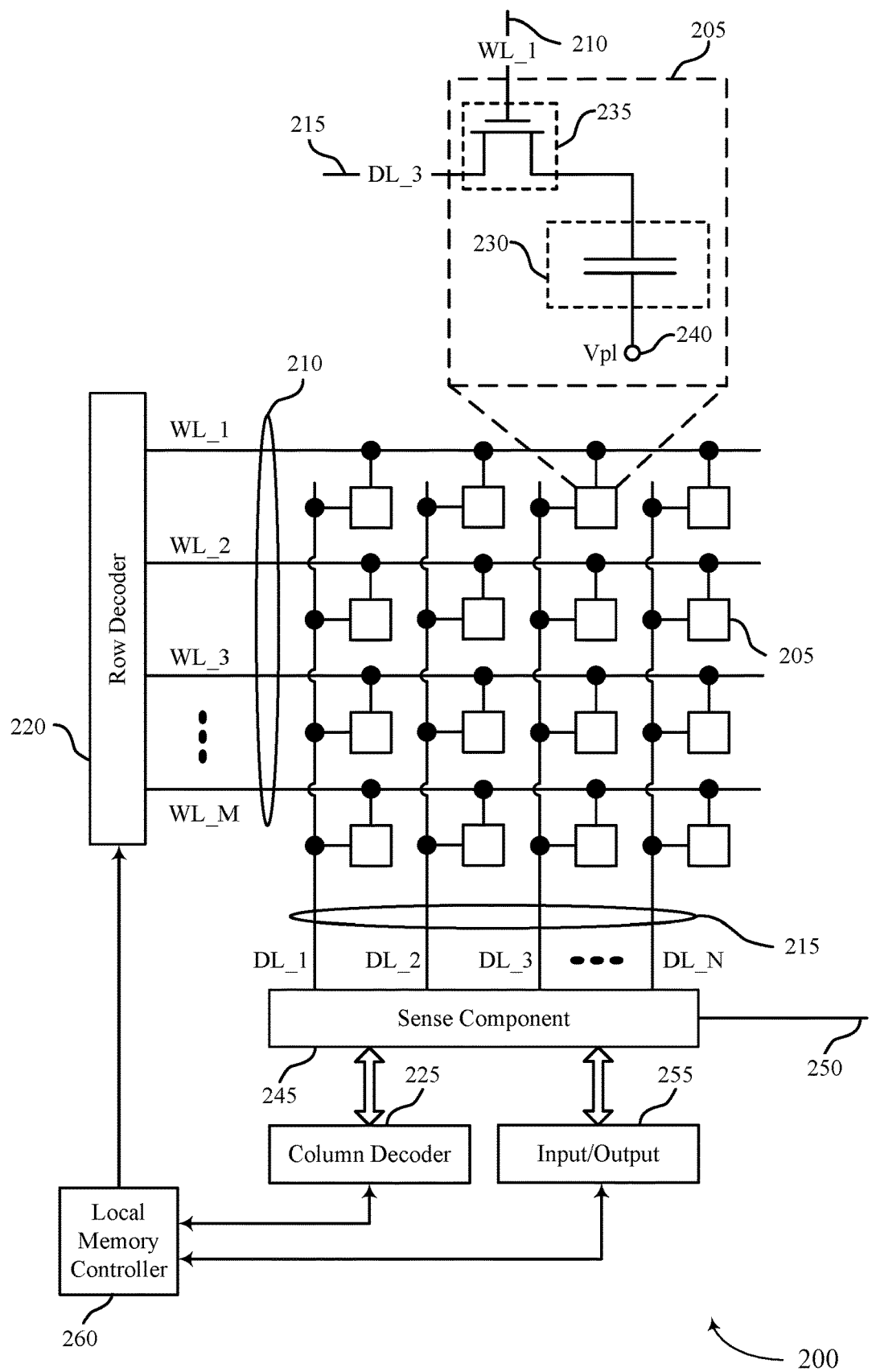
FIG. 2 illustrates an example of a memory die that supports operating an amplifier with a controllable pull-down capability in accordance with examples as disclosed herein.

FIG. 2 illustrates an example of a memory die 200 that supports operating an amplifier with a controllable pull-down capability in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vp1, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

A memory die 200 may include a power circuit that is configured to provide power to one or more components within the memory die 200 (e.g., sense component 245, word line drivers, digit line drivers, etc.). In some examples, the power circuit may be (or include) a voltage regulator that is coupled with a voltage source and configured to regulate a voltage of the voltage source to obtain a voltage for operating the one or more components in memory die 200—the voltage output by the power circuit may be different (e.g., smaller) than the voltage of the voltage source. The power circuit may include an amplifier that is configured to amplify a difference between a voltage of a signal (e.g., a reference signal) that is input to the power circuit and a voltage of an internal signal that is output by the power circuit (which may also be referred to as a power signal). The power circuit may also include a transistor (e.g., a power transistor) that is configured to couple an output of the power circuit with the voltage source and to control a flow of current from the voltage source to the output of the power circuit. In some examples, the amplifier and power transistor are configured to maintain the voltage output by the power circuit at a desired voltage (e.g., a voltage that is the same as or offset from the reference voltage)—e.g., by configuring the amplifier and power transistor in a voltage-follower configuration.

The amplifier may include a bias circuit, an input circuit, and an output circuit. In some examples, the amplifier may be a differential amplifier, an operational transconductance amplifier (OTA), or a combination thereof. The bias circuit may be configured to enable an operation of the amplifier—e.g., by properly biasing the transistors within the amplifier and/or providing a bias current that enables the operation of the amplifier. The input circuit may include a differential pair of transistors and a current mirror (in such cases, the input circuit may be referred to as a differential input circuit.

The differential input circuit may be used to detect differences between input signals that are applied to opposite transistors of the differential pair. The output circuit may be configured to drive the output of the amplifier to a first voltage or a second voltage based on whether the input signal provided to a first transistor of the differential pair has a larger voltage than the input signal provided to a second transistor of the differential pair. In some examples, the output circuit includes a pull-up circuit configured to couple the output of the amplifier with a first voltage source and a pull-down circuit configured to couple the output of the amplifier with a second voltage source having a lower voltage than the first voltage source.

The amplifier may also include control circuitry that is used to control the pull-up circuit and the pull-down circuit. In some examples, the control circuitry includes a pull-down reference signal generator that provides a reference current for the pull-down circuit, where an amount of current pulled (or "sunk") by the pull-down may be based on the reference current. In some examples, the control circuitry includes a first branch of a current mirror, and the pull-down circuit includes the second branch of the current mirror, where the reference current generated by the pull-down reference current generator may be applied to the first branch of the current mirror. The control circuitry may also include a pull-up reference signal generator that provides a reference current for the pull-up circuit, where an amount of current pulled (or "sourced") by the pull-up circuit may be based on the reference current. In some examples, the pull-up circuit and the pull-down circuit are configured so that the pull-up circuit can source the same amount of current that the pull-down circuit can sink—that is, the pull-up circuit and pull-down circuit may be balanced to improve a linear operation of the input signal. In some examples, the pull-up reference signal generator uses components of the differential input circuit to generate the reference circuit (e.g., a branch of the current mirror of the differential input circuit may be used to generate the reference current for the pull-up circuit). As described herein, an output of the amplifier may be coupled with a gate of a power transistor and a drain of the power transistor may be coupled with an input (e.g., a negative input) of the amplifier—that is, the amplifier and power transistor may be configured in a voltage-follower configuration.

During operation of the power circuit, a signal output by the amplifier may be applied to a gate of the power transistor and used to control an amount of current that is sourced by the power transistor to an output of the power circuit. When the voltage at a drain of the power transistor (which may also correspond to the voltage output by the power circuit) exceeds (or matches) the reference voltage input to the amplifier, the signal output by the amplifier may deactivate (or "turn-off") the power transistor such that no current (or a minimal current, such as current due to leakage) is sourced by the power transistor. To deactivate the power transistor, the signal output by the amplifier may have a high voltage such that a voltage difference between a source of the power transistor and the signal output by the amplifier is less than a threshold voltage of the power transistor. And when the voltage at the drain of the power transistor is below the reference voltage, the signal output by the amplifier may activate (or "turn-on") the power transistor. To activate the power transistor, the signal output by the amplifier may have a low voltage such that a voltage difference between a source of the power transistor and the signal output by the amplifier is greater than a threshold voltage of the power transistor— the larger the difference between the reference voltage and the voltage output by the power circuit, the larger the amount of current sunk by the pull-down circuit, the more quickly the voltage of the signal output by the amplifier is pulled down to a low-voltage supply, the more completely (or "harder") the power transistor is turned on, and the higher the amount of current sourced by the power transistor to the output of the power circuit.

When the voltage output by the power circuit is below the reference voltage (or a voltage offset from the reference voltage), the signal output by the amplifier may trend toward a lower voltage based on the pull-down circuit being activated. In some examples, the voltage output by the power circuit drops below the reference voltage in response to a loading event (e.g., when multiple sense components and drivers powered by the power circuit are activated for a read operation). Once the voltage difference between the signal output by the amplifier and the source of the power transistor exceeds the threshold voltage of the power transistor, the power transistor may begin conducting current from the voltage source to the output of the power circuit. In some examples, the power transistor may conduct, for a duration, the current until the voltage of an internal signal output by the power circuit reaches a voltage of the reference voltage input to the amplifier. In some examples, when the voltage of the internal signal falls below the reference voltage, the power transistor conducts a larger amount of current than an amount of current being pulled from the power circuit so that the voltage output by the power circuit may be increased.

As described herein, the amount of current conducted by the power transistor may depend on the voltage difference between the signal output by the amplifier and the source of the power transistor. Also, the amount of current conducted by the power transistor may vary over the duration based on the voltage difference between a reference signal and an internal signal. As also described herein, the pull-up and pull-down circuits of the amplifier may be used to drive the output of the amplifier to a first voltage or a second voltage. In some examples, the stronger the pull-up and pull-down functionality of the amplifier, the more quickly the output of the amplifier may transition between voltages, and the more quickly the amount of current conducted by the power transistor may be changed—which may enable the voltage of the internal signal to be restored to a programmed voltage more quickly. One option for strengthening the pull-down functionality of the amplifier may include increasing an upper limit of the reference current for the pull-up/down circuit. Another option for strengthening the pull-up/down functionality of the amplifier may include increasing a multiplier between a first branch of a current mirror included in a pull-up/down control circuit and second branch of the current mirror included in the pull-up/down circuit—e.g., by increasing a size and/or quantity of the transistors in the second branch of the current mirror. In some examples, the pull-up and pull-down functionalities may be balanced so that the pull-up circuit is capable of sourcing a same amount of current as the pull-down circuit is capable of sinking.

But increasing a strength of a pull-up/down functionality of an amplifier may increase an amount of power consumed by the amplifier. That is, if the strength of the pull-up/pull-down functionality is increased, the current used by the pull-up and pull-down circuits may increase, and the average current used by the amplifier during operation may increase. Additionally, modifying the transistors and/or adding transistors to an amplifier to increase the strength of the pull-up/down functionality of the amplifier may change a frequency response of the amplifier.

To enhance a performance of an amplifier in a power circuit with minimal (or no) increase in the average power consumed by the amplifier and with minimal (or no) effect to the frequency response of the amplifier, a power circuit may include an amplifier that is configured so that a pull-down capability of the amplifier is controllable (e.g., may be boosted). In some examples, a memory device may include a memory array and a power circuit that provides an internal signal to one or more components of the memory array. The power circuit may include an amplifier that outputs, based on a difference between a first input signal and a second input signal, a control signal for generating the internal signal. Also, a pull-down capability of the amplifier may be controlled based on the difference between the first input signal and the second input signal. In some examples, a comparator is used to detect the difference between the first input signal and the second input signal and to control the pull-down capability of the amplifier—e.g., the comparator may generate a signal that increases a pull-down capability of the amplifier when a voltage difference between the first input signal and the second input signal exceeds a threshold. In some examples, the comparator is integrated into the amplifier—e.g., transistors of the comparator may be integrated with transistors of the amplifier, the comparator and amplifier may be included in a same package, the comparator and amplifier may share a bias circuit, aspects of the amplifier may be used to control aspects of the comparator, or any combination thereof.

By controlling the pull-down capability of the amplifier, a response of the power circuit to loading events may be improved with minimal effect to the average power consumption and/or frequency response of the amplifier—relative to permanently strengthening the pull-down capability of the amplifier to improve the response of the power circuit. By integrating the comparator into the amplifier, an amount of current used to operate the amplifier may be reduced relative to having a separate comparator and amplifier—e.g., because the comparator and amplifier may share a bias current and circuits for generating reference currents—and a footprint of the amplifier may be smaller than a combined footprint of a separate amplifier and comparator.

Figure 3:
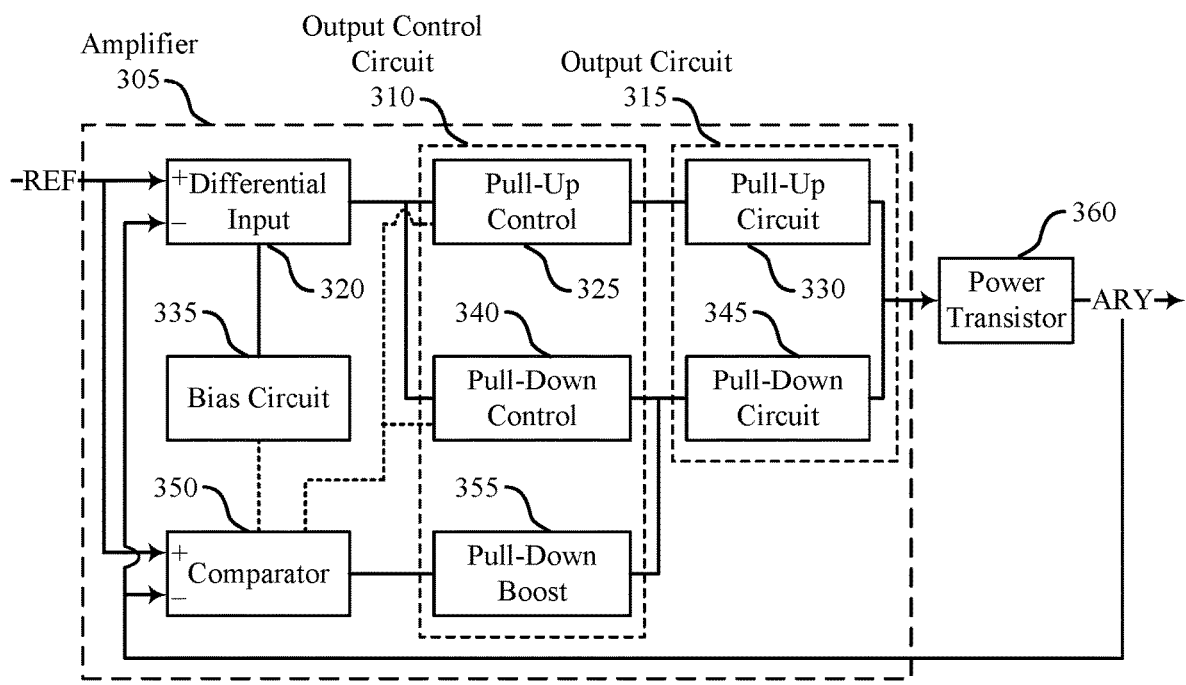
FIGS. 3 and 4 illustrate examples of circuits that support operating an amplifier with a controllable pull-down capability in accordance with examples as disclosed herein.

FIG. 3 illustrates an example of a circuit 300 that supports operating an amplifier with a controllable pull-down capability in accordance with examples as disclosed herein. Circuit 300 depicts a block-level diagram of a voltage regulating circuit. In some examples, power circuit may include (or be) a voltage regulator. Circuit 300 may be included in a memory device and configured to generate an internal signal for components within the memory device (e.g., drivers, sense components, a memory array, etc.), the internal signal having a desired voltage. Circuit 300 may include an amplifier 305, a comparator 350, and a power transistor 360.

Amplifier 305 may be configured to amplify a difference (e.g., a voltage difference) between a first input signal received at a positive input of amplifier 305 and a second input signal received at a negative input of amplifier 305. The first input signal may be a reference signal having a reference voltage and the second input signal may be an internal signal output by circuit 300. In some examples, amplifier 305 may be an example of an OTA. Amplifier 305 may include differential input circuit 320, bias circuit 335, output control circuit 310, and output circuit 315.

Differential input circuit 320 may be configured to receive multiple input signals and to detect differences between the input signals. Differential input circuit 320 may include a differential pair of transistors that is coupled with a set of transistors that are configured in a current mirror configuration. One of the transistors in the differential pair may be associated with a positive input of differential input circuit 320, and the other transistor in the differential pair may be associated with a negative input of differential input circuit 320. Differential input circuit 320 may indicate a polarity of a voltage difference between the input signals—e.g., by outputting, at a first branch of the current mirror, a signal that has a first voltage (e.g., a high voltage) when the voltage at the positive input of differential input circuit 320 is greater than the voltage at the negative input of differential input circuit 320 and a second voltage (e.g., a low voltage) when the voltage at the positive input of differential input circuit 320 is less than the voltage at the negative input of differential input circuit 320. In some cases, a voltage of a signal at the one branch of the current mirror is complementary to the voltage of the signal at the other branch of the current mirror.

Bias circuit 335 may be configured to generate a bias signal that enables an operation of amplifier 305. Bias circuit 335 may be coupled with differential input circuit 320 and configured to generate a current that is to be provided by the first branch of the current mirror of differential input circuit 320, the second branch of the current mirror of differential input circuit 320, or a combination of the two—e.g., based on a voltage difference between the first input signal and the second input signal. In some examples, the voltage of the branches of the current mirror of differential input circuit 320 is based on an amount of current being conducted by the respective branches to provide the bias current.

Output control circuit 310 may be configured to control output circuit 315—e.g., by generating signals that activate/deactivate a pull-up circuit 330 and pull-down circuit 345. Output control circuit 310 may generate and/or provide reference voltages and/or reference currents for pull-up circuit 330 and pull-down circuit 345. In some examples, output control circuit 310 includes (or uses) aspects of differential input circuit 320. Output control circuit 310 may include pull-up control circuit 325, pull-down control circuit 340, and pull-down boost circuit 355.

Pull-up control circuit 325 may be configured to control (activate/deactivate) pull-up circuit 330. Pull-up control circuit 325 may generate a control signal that controls an amount of current sourced through pull-up circuit 330 from a high-voltage source to an output of amplifier 305. In some examples, pull-up control circuit 325 may be configured to turn on and turn off the pull-up circuit 330. Pull-up control circuit 325 may also be configured to configure the pull-up circuit 330 in intermediary states that are between the on state and off state. In some examples, pull-up control circuit 325 includes a branch of the current mirror in differential input circuit 320 and a conductive trace that connects the branch of the current mirror to gates of one or more transistors included in pull-up control circuit 325 such that the transistor of the current mirror in differential input circuit 320 and the one or more transistors in pull-up control circuit 325 form a current mirror. Thus, the current conducted by the transistor of the current mirror in differential input circuit 320 may act as a reference current for the current conducted by the one or more transistors in pull-up control circuit 325.

Pull-down control circuit 340 may be configured to control (activate/deactivate) pull-down circuit 345. Pull-down control circuit 340 may generate a control signal that controls an amount of current sunk through pull-down circuit 345 from a low-voltage source to an output of amplifier 305. In some examples, pull-down control circuit 340 may be configured to turn on and turn off the pull-down circuit 345.

Pull-down control circuit 340 may also be configured to configure the pull-down circuit 345 in intermediary states that are between the on state and off state. In some examples, pull-down control circuit 340 includes a branch of the current mirror in differential input circuit 320 that is opposite than the branch of the current mirror included in pull-up control circuit 325. Pull-down control circuit 340 may also include a conductive trace that connects the branch of the current mirror in differential input circuit 320 to a gate of another transistor such that the transistor in the branch of the current mirror in differential input circuit 320 and the other transistor act as a current mirror. A drain of the other transistor may be coupled with a source of an additional transistor, where the additional transistor may be coupled with one or more transistors in pull-down control circuit 340 such that the additional transistor and the one or more transistors in pull-down control circuit 340 form an additional current mirror. Thus, the current conducted by the additional transistor of the additional current mirror may act as a reference current for the current conducted by the one or more transistors in pull-down control circuit 340.

Pull-down boost circuit 355 may also be configured to dynamically control the pull-down circuit 345 when activated. In some examples, pull-down boost circuit 355 may increase (e.g., double) an amount of current conducted by the additional transistor of the additional current mirror, increasing an amount of the reference current for pull-down circuit 345. Pull-down boost circuit 355 may include a component that enables the activation and deactivation of pull-down boost circuit 355. In some examples, pull-down boost circuit 355 also increases an upper limit of a reference current that may be generated for pull-down circuit 345.

Output circuit 315 may be configured to drive an output voltage of amplifier 305 to a first voltage (e.g., a high voltage) or a second voltage (e.g., a low voltage) based on a voltage difference detected between the input signals at differential input circuit 320. In some examples, output circuit 315 may be configured to couple the output of amplifier 305 with one or both of high-voltage source or a low-voltage source. Output circuit 315 may include pull-up circuit 330 and pull-down circuit 345.

Pull-up circuit 330 may be configured to couple a voltage source (e.g., a high-voltage source) with an output of amplifier 305. Pull-up circuit 330 may be controlled by pull-up control circuit 325. Pull-up circuit 330 may also be configured to source variable amounts of current to the output of amplifier 305. The amount of current sourced by pull-up circuit 330 may be based on a reference current and/or reference voltage provided by pull-up control circuit 325. A rate at which a voltage of the output of amplifier 305 increases may be based on the amount of current being sourced by pull-up circuit 330.

Pull-down circuit 345 may be configured to couple another voltage source (e.g., a low-voltage source) with the output of amplifier 305. Pull-down circuit 345 may be controlled by pull-down control circuit 340. Pull-down circuit 345 may also be configured to sink variable amounts of current from the output of amplifier 305. The amount of current sunk by pull-down circuit 345 may be based on a reference current and/or reference voltage provided by pull-down control circuit 340. A rate at which a voltage of the output of amplifier 305 decreases may be based on the amount of current being sunk by pull-down circuit 345.

Comparator 350 may be configured to compare a difference (e.g., a voltage difference) between a first input signal received at a positive input of comparator 350 and a second input signal received at a negative input of comparator 350 and to signal an indication of the difference. In some examples, comparator 350 may output a first voltage (e.g., a high voltage) when a voltage of the first input signal is greater than a voltage of the second input signal and a second voltage (e.g., a low voltage) when a voltage of the first input signal is less than a voltage of the second input signal. In some examples, comparator 350 may be configured to take into account an offset between the first input signal and the second input signal. In such cases, comparator 350 may output a first voltage (e.g., a high voltage) when a voltage of the first input signal is greater than a voltage of the second input signal plus an offset voltage (when $V_{POS} > V_{NEG} + V_A$) and a second voltage (e.g., a low voltage) when a voltage of the first input signal is less than a voltage of the second input signal plus the offset voltage. Comparator 350 may be further configured to signal the difference to pull-down boost circuit 355 to control (e.g., activate/deactivate) pull-down boost circuit 355.

Similar to amplifier 305, comparator 350 may include a differential input circuit, a pull-up/down control circuit, and an output circuit. In some examples, to implement the offset functionality, a differential pair of transistors included in the differential input circuit of comparator 350 may be configured so that one transistor of the transistors has a larger size than the other transistor of the transistors—e.g., the larger transistor may be associated with the negative input of the differential pair.

In some examples, comparator 350 may be integrated with amplifier 305. In such cases, comparator 350 may also be coupled with bias circuit 335—that is, bias circuit 335 may be used to generate a bias current for the differential input circuit of comparator 350. Also, comparator 350 may be coupled with pull-up control circuit 325, pull-down control circuit 340, and pull-down boost circuit 355. That is, pull-up control circuit 325 may provide a reference current and/or reference voltage to a pull-up circuit included in the output circuit of comparator 350. And pull-down control circuit 340 and pull-down boost circuit 355 may provide a reference current and/or reference voltage to a pull-up circuit included in the output circuit of comparator 350. Amplifier 305 and comparator 350 may also share a package having common input pins and/or common voltage supply pins.

In other examples, comparator 350 may not be integrated with amplifier 305 and may be external to amplifier 305. In such cases, comparator 350 may include a separate bias circuit and control circuit. Integrating the comparator 350 with amplifier 305 may decrease a footprint of the circuits and decrease power consumption relative to configuring the comparator 350 and amplifier 305 separately. Additionally, if the comparator 350 is not integrated with the amplifier 305, the duration between detecting that a voltage difference satisfies a threshold and when the pull-up circuit or pull-down circuit may be more than a duration if the comparator 350 is integrated with the amplifier 305.

Power transistor 360 may be configured to couple an output of circuit 300 with a voltage source (e.g., a high-voltage source). Power transistor 360 may also be configured to conduct current from the voltage source to the output of circuit 300. A state (e.g., on state, off state, or some intermediary state) of power transistor 360 may be controlled by amplifier 305—e.g., based on a voltage of a signal output by amplifier 305 at a gate of power transistor 360. In some examples, power transistor 360 may be in an off state when a voltage difference between the voltage source and the output of amplifier 305 is below a threshold voltage of power transistor 360 and enter an on state when the voltage difference between the voltage source and the output of amplifier 305 exceeds the threshold. In some examples, power transistor 360 may be in varying levels of the on state based on the voltage difference between the voltage source and the output of amplifier 305—e.g., the power transistor 360 may be turned on harder (or more completely) or softer (or partially).

Collectively, amplifier 305, comparator 350, and power transistor 360 may be configured to maintain/restore a voltage output by circuit 300 at/to a desired voltage. To maintain the voltage output by circuit 300, amplifier 305 and power transistor 360 may be coupled together in a voltage-follower configuration such that a drain of power transistor 360 (and an output of circuit 300) is coupled with a negative input of amplifier 305. Such a configuration may provide negative feedback to amplifier 305 that causes the output of amplifier 305 to operate in a manner that increases the voltage of the negative input of amplifier 305 until the voltage of the negative input matches the voltage of (or a voltage offset from) the positive input of amplifier 305. Pull-down boost circuit 355 may enable the power transistor 360 to be turned on faster and/or harder, increasing an amount of current supplied to the output of circuit 300 and decreasing a an amount of time the output of circuit 300 has a lower voltage than the voltage of (or a voltage offset from) the positive input of amplifier 305.

Figure 4:
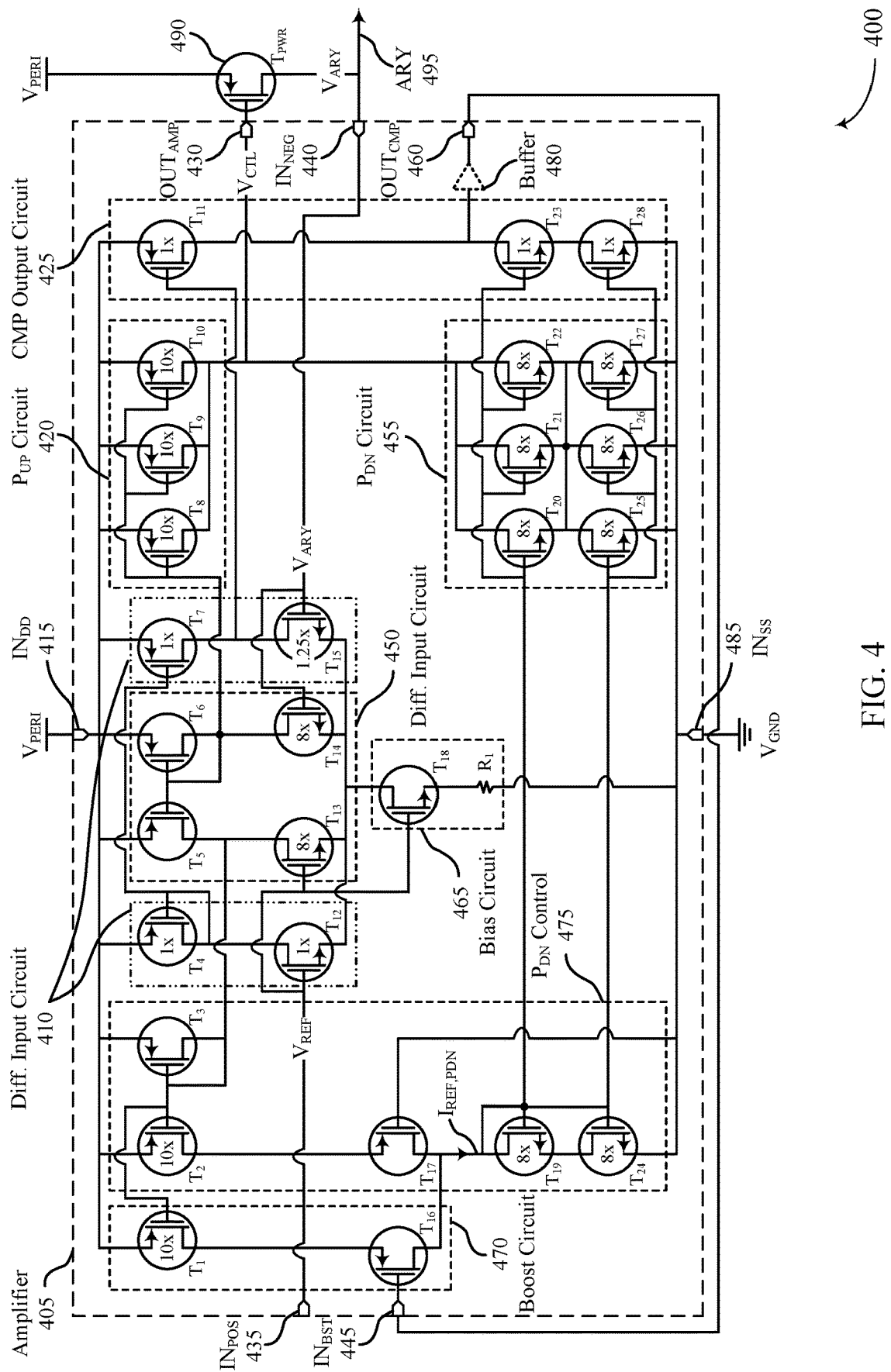

FIG. 4 illustrates an example of a circuit 400 that supports operating an amplifier with a controllable pull-down capability in accordance with examples as disclosed herein. Circuit 400 depicts a transistor-level diagram of a voltage regulating circuit. The transistor-level diagram also depicts an example of different relative sizes used for transistors in circuit 400, though other configurations are possible without departing from the principles described herein.

Circuit 400 may be configured to generate an internal signal that provides power to a memory array at a desired voltage (which may be referred to as $V_{ARY}$). In some examples, circuit 400 may include (or be) a voltage regulator. Circuit 400 may be an example of circuit 300, as described in FIG. 3. Circuit 400 may include amplifier 405 and power transistor 490, which may be respective examples of amplifier 305 and power transistor 360 described in FIG. 3.

Amplifier 405 may include amplifier differential input circuit 450, bias circuit 465, pull-down control circuit 475, pull-down boost circuit 470, amplifier pull-up circuit 420, and amplifier pull-down circuit 455, which may be respective examples of differential input circuit 320, bias circuit 335, pull-down control circuit 340, pull-down boost circuit 355, pull-up circuit 330, and pull-down circuit 345 described in FIG. 3. Amplifier 405 may also include an integrated comparator that includes comparator differential input circuit 410, comparator output circuit 425, and buffer 480. The integrated comparator may be an example of comparator 350 of FIG. 3. In some examples, amplifier 405 may be configured to improve linear operation (e.g., optimize), while the integrated comparator may be configured to improve saturated operation (e.g., optimize).

Amplifier differential input circuit 450 may be configured to receive one or more inputs (e.g., a reference signal and an internal signal output by circuit 400) and used to support an amplification functionality of amplifier 405. Amplifier differential input circuit 450 may include a differential pair of transistors (e.g., $T_{13}$ and $T_{14}$) and a pair of transistors that are configured as a current mirror (e.g., $T_5$ and $T_6$), such that a same (or similar) amount of current flows through the transistors of the current mirror while the current mirror transistors remain in an active state. In some examples, a first transistor (e.g., $T_{13}$) of the differential pair is associated with a positive input of amplifier 405, and a second transistor (e.g., $T_{14}$) of the differential pair is associated with a negative input of amplifier 405.

Comparator differential input circuit 410 may be configured to receive one or more inputs (e.g., a reference signal and an internal signal output by circuit 400) and used to support a comparison functionality of amplifier 405. Comparator differential input circuit 410 may include a differential pair of transistors (e.g., $T_{12}$ and $T_{15}$) and a pair of transistors that are configured as a current mirror (e.g., $T_2$ and $T_7$). In some examples, a first transistor (e.g., $T_{12}$) of the differential pair is associated with a positive input of amplifier 405, and a second transistor (e.g., $T_{15}$) of the differential pair is associated with a negative input of amplifier 405. In some examples, transistors included in a differential pair of transistors may be referred to as differential transistors.

In some examples, the differential transistors in amplifier differential input circuit 450 may be around eight times as large as the differential transistors included in comparator differential input circuit 410—thus, around eight times more current may flow through the amplifier differential transistors than the comparator differential transistors during operation. In some examples, a size of a first differential transistor in comparator differential input circuit 410 is different than a size of a second differential transistor in comparator differential input circuit 410—e.g., the rightmost differential transistor may be 1.25 times larger than the leftmost differential transistor. Thus, comparator differential input circuit 410 may transition between voltages when a voltage of a signal input to the leftmost differential transistor of comparator differential input circuit 410 is greater than a voltage of a signal input to the rightmost differential transistor of comparator differential input circuit 410 by an offset voltage.

Bias circuit 465 may be configured to provide a bias current for amplifier differential input circuit 450 and comparator differential input circuit 410. Bias circuit 465 may include a transistor (e.g., $T_{18}$) and a resistor (e.g., $R_1$). A voltage applied to a gate of transistor $T_{18}$, a threshold voltage of $T_{18}$, and a resistance of $R_1$ may determine a magnitude of the bias current generated by bias circuit 465. In some examples, around an eighth of the bias current may be used by comparator differential input circuit 410, while the remaining portion of the bias current may be used by amplifier differential input circuit 450—e.g., based on the relative size of the differential transistors in amplifier differential input circuit 450 and comparator differential input circuit 410.

Together the differential input circuits and bias circuit 465 may be used to detect and/or amplify voltage differences between signals input to the differential input circuits. That is, for amplifier differential input circuit 450, the branches of the current mirror may be configured to supply the bias current programmed by bias circuit 465. However, if one of the differential transistors is turned on more strongly than the other (e.g., if a voltage difference between a gate and source of one differential transistor is larger than a voltage difference between a gate and source of the other differential transistor), more of the current may be supplied through that differential transistor (e.g., $T_{13}$), while a same amount of current may be supplied by both of the current mirror transistors. Accordingly, more current may flow through the differential transistor than the other differential transistor (e.g., $T_{14}$), and a voltage may build up at the node between the other differential transistor and the corresponding current mirror transistor (e.g., $T_6$). Additionally, a voltage at the node between the differential transistor and corresponding current mirror transistor (e.g., $T_5$) may be pulled down (e.g., toward a ground reference).

The opposite may occur if a larger voltage difference between a gate and source of the other differential transistor is larger than a voltage difference between a gate and source of the one differential transistor. Thus, if the voltage of the node between $T_{14}$ and $T_6$ is high, amplifier differential input circuit 450 may indicate that the voltage of the input signal applied to $T_{13}$ is larger than the voltage of the input signal applied to $T_{14}$. And if the voltage of the node between $T_{14}$ and $T_6$ is low, amplifier differential input circuit 450 may indicate that the voltage of the input signal applied to $T_{13}$ is smaller than the voltage of the input signal applied to $T_{14}$. Comparator differential input circuit 410 may operate similarly. In some examples, the operation of comparator differential input circuit 410 is complementary to the operation of amplifier differential input circuit 450.

The voltages generated by the differential input circuits may be used to control other aspects of amplifier 405. In some examples, the voltage output by the rightmost branch of amplifier differential input circuit 450 may be used to control an amount of current sourced by amplifier pull-up circuit 420 to pull up a voltage output by amplifier 405. Also, the voltage output by the leftmost branch of amplifier differential input circuit 450 may be used to control (via pull-down control circuit 475) an amount of current sunk by amplifier pull-down circuit 455 to pull down a voltage output by amplifier 405.

Pull-down control circuit 475 may be configured to generate a reference current for amplifier pull-down circuit 455 based on a voltage of the leftmost branch of amplifier differential input circuit 450. Pull-down control circuit 475 may include a first set of transistors in a current mirror configuration (e.g., $T_2$ and $T_3$) and additional transistors (e.g., $T_{17}$, $T_{19}$, and $T_{24}$). The lower transistors ($T_{19}$ and $T_{24}$) may generate a reference voltage that corresponds to the reference current that flows through the lower transistors. The reference voltage may be provided to the transistors ($T_{20}$, $T_{21}$, $T_{22}$, $T_{25}$, $T_{26}$, and $T_{27}$) included in amplifier pull-down circuit 455. The reference voltage may also be provided to the lower transistors ($T_{23}$ and $T_{28}$) of comparator output circuit 425. In some examples, pull-down control circuit 475 is configured with less transistors—e.g., pull-down control circuit 475 may include only $T_2$ and $T_{19}$.

Amplifier pull-up circuit 420 may be configured to couple an output of amplifier 405 with a voltage supply rail (e.g., a high-voltage supply rail). Amplifier pull-up circuit 420 may be further configured to supply a current to the output of amplifier 405 based on a voltage of the rightmost branch of amplifier differential input circuit 450, pulling a voltage of the output of amplifier 405 up. In some examples, the current supplied by amplifier pull-up circuit 420 is based on (e.g., proportional to or a multiple of) the current being conducted by the rightmost current mirror transistor (e.g., $T_6$) of amplifier differential input circuit 450—e.g., collectively, transistors $T_8$, $T_9$, and $T_{10}$ may conduct thirty times the current as $T_6$. In some examples, amplifier pull-up circuit 420 is configured with less transistors—e.g., amplifier pull-up circuit 420 may be configured with only $T_8$.

Amplifier pull-down circuit 455 may be configured to couple an output of amplifier 405 with a voltage supply rail (e.g., a low-voltage supply rail). Amplifier pull-down circuit 455 may be further configured to sink a current from the output of amplifier 405 based on a voltage of the leftmost branch of amplifier differential input circuit 450 and/or the voltage of the lower transistors (e.g., $T_{19}$ and $T_{24}$) of pull-down control circuit 475, pulling a voltage of the output of amplifier 405 down. In some examples, the current sunk by amplifier pull-down circuit 455 is based on (e.g., proportional to or a multiple of) the current ($I_{REF}$) being conducted by the lower transistors (e.g., $T_{19}$ and $T_{24}$) of pull-down control circuit—e.g., collectively, transistors $T_{20}$, $T_{21}$, $T_{22}$, $T_{25}$, $T_{26}$, and $T_{27}$ may conduct three times the current as $T_{19}$ and $T_{24}$. In some examples, amplifier pull-down circuit 455 is configured with less transistors—e.g., amplifier pull-down circuit 455 may be configured with only $T_{20}$, $T_{21}$, and $T_{22}$ or with only $T_{20}$.

Comparator output circuit 425 may be configured to pull-up and pull-down an output of the comparator that is integrated into amplifier 405. Similar to amplifier 405, comparator output circuit 425 may include a pull-up circuit (e.g., which may include $T_{11}$) and a pull-down circuit (e.g., which may include $T_{23}$ and $T_{28}$). Also, the pull-up circuit of the comparator may be controlled based on the rightmost branch of comparator differential input circuit 410. Additionally, the pull-down circuit of the comparator (which may include $T_{23}$ and $T_{28}$) may be controlled based on the leftmost branch of amplifier differential input circuit 450—that is, the pull-down circuit of the comparator may be controlled using a same control signal as amplifier pull-down circuit 455.

Pull-down boost circuit 470 may be configured to boost a reference current generated for amplifier pull-down circuit 455, increasing a pull-down strength of amplifier pull-down circuit 455 and boosting a current sourced by power transistor 490. In some examples, pull-down boost circuit 470 may double the reference current generated by pull-down control circuit 475. Pull-down boost circuit 470 may include a first transistor (e.g., $T_1$) that is similarly configured as and coupled with a transistor (e.g., $T_2$) included in pull-down control circuit 475. The first transistor in pull-down boost circuit 470 may generate a same (or similar) amount of current as the transistor included in pull-down control circuit 475. Pull-down boost circuit 470 may also include a second transistor (e.g., $T_{16}$) that is configured to enable/disable an operation of pull-down boost circuit 470. That is, when second transistor is in an off state, pull-down boost circuit 470 may not conduct any current, and when second transistor is in an on state, pull-down boost circuit 470 may conduct current that combines with the reference current generated by pull-down control circuit 475. In some examples, pull-down boost circuit 470 temporarily imbalances the pull-up and pull-down capabilities of amplifier 405, enabling faster operation during transient intervals of operation and improving linear operation of amplifier 405 during sustained intervals of operation.

In some examples, an operation of pull-down boost circuit 470 may be controlled by an output of the comparator integrated within amplifier 405. In some examples, the output of the comparator is coupled with an input of pull-down boost circuit 470—e.g. via a conductive trace or wire. In some examples, amplifier 405 may also include buffer 480, which may isolate an output of the comparator from an input of pull-down boost circuit 470. Buffer 480 may be (or include) a voltage buffer.

In some examples, amplifier 405 is contained in a package that includes pins for accessing aspects of amplifier 405. For examples, amplifier 405 may include a positive input pin 435 (which may be referred to as $IN_{POS}$), a negative input pin 440 (which may be referred to as $IN_{NEG}$), an amplifier output pin 430 (which may be referred to as $OUT_{AMP}$), a high-voltage supply pin 415 (which may be referred to as $IN_{DD}$), and a low-voltage supply pin 485 (which may be referred to as $IN_{SS}$). In some examples a reference voltage that may be used to set a voltage for circuit 400 may be received at positive input pin 435, and a voltage output by circuit 400 may be received at negative input pin 440. High-voltage supply pin 415 may receive a high voltage (which may be referred to as $V_{PERI}$) and low-voltage supply pin 485 may coupled with a ground reference (which may be referred to as $V_{GND}$). Amplifier output pin 430 may be coupled with an input of power transistor 490 and may output a control signal for power transistor 490.

Amplifier 405 may also include a boost control pin 445 (which may be referred to as $IN_{BST}$) and a comparator output pin 460 (which may be referred to as $OUT_{CMP}$). Boost control pin 445 may receive a signal that controls the pull-down boost circuit 470. Comparator output pin 460 may signal an output of the integrated comparator. In some examples, boost control pin 445 and comparator output pin 460 are coupled together and the output of the integrated comparator is used to control pull-down boost circuit.

Power transistor 490 (which may be referred to as $T_{PWR}$) may be configured to couple an output of circuit 400 with a high-voltage supply line. In some examples, a voltage of the supply line may be at $V_{PERI}$. In some examples, a channel length and/or width of power transistor may be 1800 microns. Power transistor 490 may also be configured to source a current to the output of circuit 400 based on a voltage output from the amplifier output pin 430.

Together, amplifier 405 and power transistor 490 may be configured to maintain a voltage of internal signal 495 (which may be referred to as ARY), which may be output by circuit 400 at a voltage that is similar to (e.g., the same as or offset from) the voltage of the reference signal applied to positive input pin 435 (e.g., $V_{REF}$ or $V_{REF}-V_A$). To maintain the voltage of circuit 400 at a desired voltage, amplifier 405 and power transistor 490 may be configured in a voltage-follower configuration such that a drain of power transistor 490 (and thus an output of circuit 400) is coupled with negative input pin 440. That is, when a voltage of internal signal 495 (which may be referred to as $V_{ARY}$) drops below a voltage of the reference signal (which may be referred to as $V_{REF}$), amplifier 405 may activate the amplifier pull-down circuit 455 to pull-down the voltage of amplifier output pin 430 (which may be referred to as $V_{CTL}$). Once a voltage difference between $V_{PERI}$ and $V_{CTL}$ falls below a threshold voltage of power transistor 490, power transistor 490 may begin sourcing current to the output of circuit 400. Additionally, when $V_{ARY}$ exceeds $V_{REF}$ (or when $V_{ARY}$ exceeds $V_{REF}$ by a threshold amount), the voltage of comparator output pin 460 may also be pulled down by the pull-down circuit of comparator output circuit 425. Thus, transistor $T_{16}$ may enter an active state and the reference current sourced by transistor $T_2$ may be supplemented by an additional current source by transistor $T_1$. Accordingly, amplifier pull-down circuit 455 may sink additional current (e.g., may pull down harder), and power transistor 490 may conduct more current (e.g., be turned on harder) to the output of circuit 400. As a result, a voltage of internal signal 495 may be pulled up toward the desired voltage faster. When $V_{ARY}$ returns to $V_{REF}$ (or within an offset of $V_{REF}$), the voltage of comparator output pin 460 may be pulled high by the pull-up circuit of comparator output circuit 425, and pull-down boost circuit 470 may be disabled.

Figure 5:
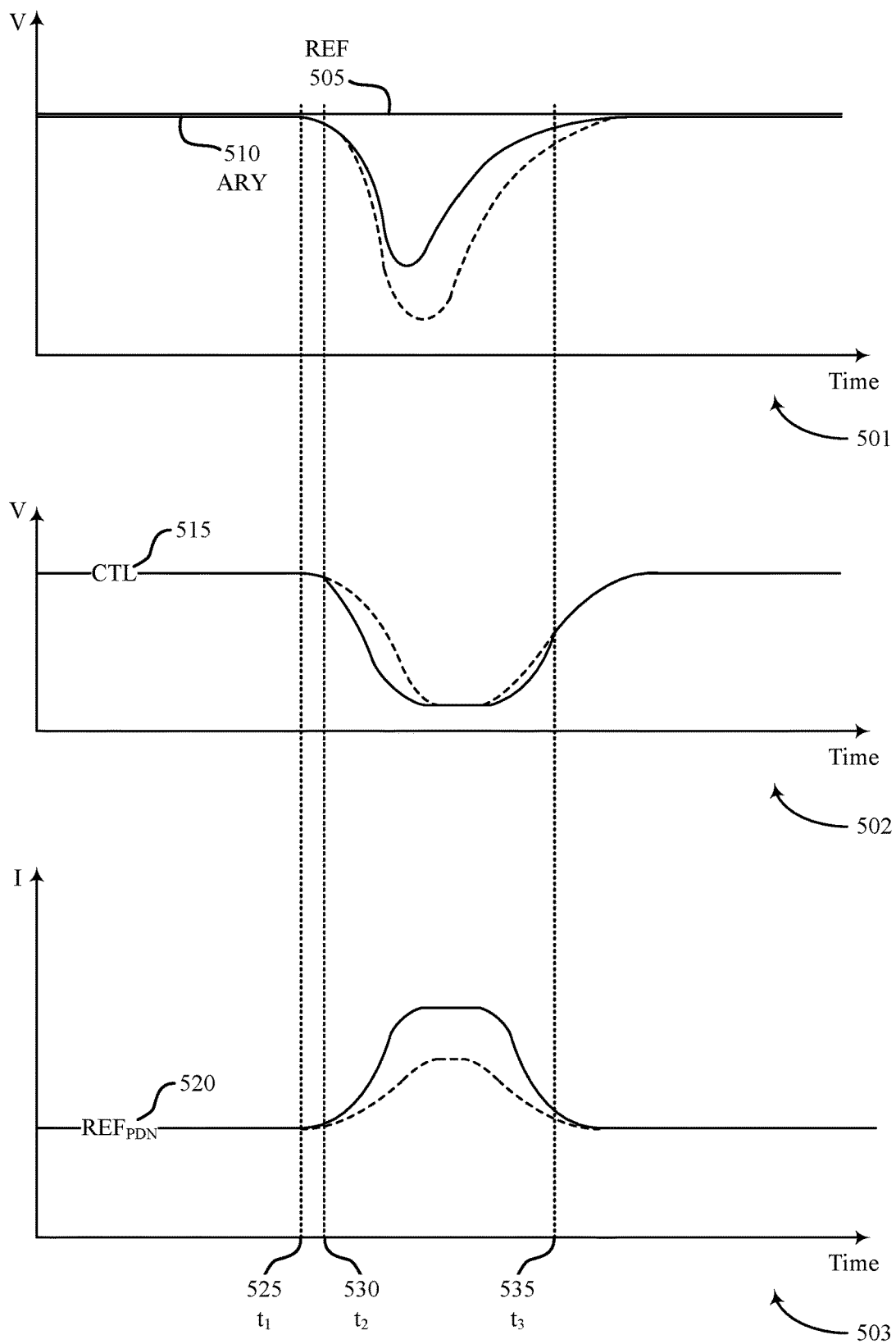
FIG. 5 illustrates an example of a signal diagram that supports operating an amplifier with a controllable pull-down capability in accordance with examples as disclosed herein.

FIG. 5 illustrates an example of a signal diagram 500 that supports operating an amplifier with a controllable pull-down capability in accordance with examples as disclosed herein. First signal diagram 501, second signal diagram 502, and third signal diagram 503 depict voltages and current within an amplifier (e.g., amplifier 405) that has a controllable pull-down capability during an operation of the amplifier.

First signal diagram 501 depicts voltages of reference signal 505 and internal signal 510 over a time period. Reference signal 505 may be received at a positive input of the amplifier, and a voltage of reference signal 505 may correspond to a voltage of positive input pin 435 of FIG. 4. Internal signal 510 may be received at a negative input of the amplifier, and a voltage of internal signal 510 may correspond to a voltage of negative input pin 440 of FIG. 4. Second signal diagram 502 depicts a voltage of control signal 515 over a time period. Control signal 515 may output by the amplifier to a gate of a power transistor (e.g., power transistor 490 of FIG. 4), and a voltage of control signal 515 may correspond to a voltage of amplifier output pin 430 of FIG. 4. Third signal diagram 503 depicts a current of pull-down reference signal 520 over a time period. A current of pull-down reference signal 520 may correspond to a current that flows through the lower transistors (e.g., $T_{19}$ and $T_{24}$) of pull-down control circuit 475 of FIG. 4 and that is used to control a current conducted by amplifier pull-down circuit 455 of FIG. 4.

At first time 525, a voltage of internal signal 510 may drop below a voltage of positive input signal 505—e.g., in response to a loading event, such as a read, write, activate, or precharge operation. Accordingly, a voltage of control signal 515 may be pulled down (e.g., weakly) toward a lower voltage, and a current of pull-down reference signal 520 may begin to increase. In some examples, a voltage of internal signal 510 may continue to decrease, and at second time 530, a voltage difference between reference signal 505 and internal signal 510 may exceed a threshold (e.g., VA). Accordingly, a voltage output by a comparator integrated within the amplifier may change and a pull-down boost circuit (e.g., pull-down boost circuit 470 of FIG. 4) may be activated. Additionally, activating the pull-down boost circuit may increase (e.g., double) the current of pull-down reference signal 520.

After the pull-down boost circuit is activated, the voltage of internal signal 510 may continue to decrease. Thus, the current of pull-down reference signal 520 may continue to increase, the amount of current sunk by the amplifier pull-down circuit may increase, and a voltage of control signal 515 may continue to decrease, causing a current conducted by the power transistor to increase. In some examples, the amplifier pull-down circuit may pull the voltage of control signal 515 down to a low voltage (e.g., a ground reference voltage or a voltage that is offset above the ground reference voltage) and remain at the low voltage until the voltage of internal signal 510 reaches a threshold voltage. Once the voltage of internal signal 510 reaches the threshold voltage, an amplifier pull-up circuit (e.g., amplifier pull-up circuit of FIG. 4) may begin to overpower the amplifier pull-down circuit, and the voltage of control signal 515 may increase. Accordingly, the current conducted by the power transistor may decrease.

At third time 535, the voltage difference between reference signal 505 and internal signal 510 may be below a threshold, and the pull-down boost circuit may be deactivated. Also, the voltage of control signal 515 may continue to increase until a voltage of internal signal 510 reaches a desired voltage and the power transistor is deactivated.

The solid lines in FIG. 5 may depict the operation of the amplifier when the pull-down boost circuit is used during operation of the amplifier. The dashed lines in FIG. 5 may depict the operation of the amplifier when the pull-down boost circuit is not used during operation of the amplifier. As depicted in FIG. 5, relative to not using the pull-down boost circuit, using the pull-down boost circuit may increase (e.g., double) an amount of current associated with pull-down reference signal 520, which may enable a voltage of control signal 515 to decrease more quickly—that is, a slew rate of the amplifier may increase in the negative direction. Accordingly, the power transistor may be turned on more quickly and/or harder, and a voltage of internal signal 510 (which may correspond to a voltage of an internal signal generated by the power circuit) may not drop as deeply and may return to a desired voltage more quickly. By decreasing the voltage drop in the internal signal and the duration of the voltage drop, a performance of a memory array powered by the power circuit may be improved—e.g., a sensing window of a sense component may be opened.

Figure 6:
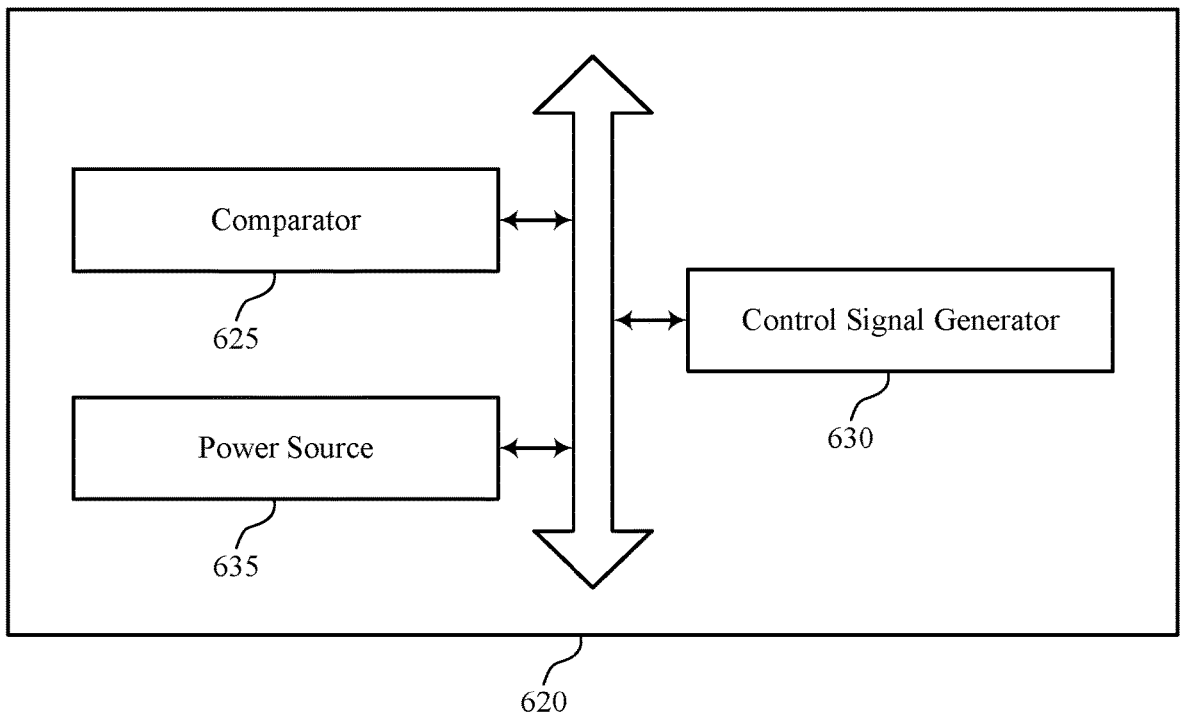
FIG. 6 shows a block diagram of a memory device that supports operating an amplifier with a controllable pull-down capability in accordance with examples as disclosed herein.

FIG. 6 shows a block diagram 600 of a memory device 620 that supports operating an amplifier with a controllable pull-down capability in accordance with examples as disclosed herein. The memory device 620 may be an example of aspects of a memory device as described with reference to FIGS. 1 through 5. The memory device 620, or various components thereof, may be an example of means for performing various aspects of operating an amplifier with a controllable pull-down capability as described herein. For example, the memory device 620 may include a comparator 625, a control signal generator 630, a power source 635, or any combination thereof. Each of these components may communicate, directly or indirectly, with one another (e.g., via one or more buses).

The comparator 625 may be configured as or otherwise support a means for comparing a reference voltage with a voltage of an internal signal output by a voltage regulator to power a memory array. The control signal generator 630 may be configured as or otherwise support a means for applying a control signal to the voltage regulator that modifies a first amount of current output by the voltage regulator based at least in part on a difference between the reference voltage and the voltage of the internal signal. The power source 635 may be configured as or otherwise support a means for modifying a second amount of current available to drive the control signal to a voltage level based at least in part on the difference between the reference voltage and the voltage of the internal signal, where a response of the internal signal to a loading event is based at least in part on the first amount of current.

In some examples, to support modifying the second amount of the current, the power source 635 may be configured as or otherwise support a means for increasing the amount of the current based at least in part on the difference between the reference voltage and the voltage of the internal signal satisfying a threshold.

In some examples, the control signal generator 630 may be configured as or otherwise support a means for increasing an upper limit of a reference current for a pull-down transistor that is coupled with the voltage regulator based at least in part on the difference between the reference voltage and the voltage of the internal signal satisfying a threshold, where the amount of available current is modified based at least in part on increasing the upper limit, and where the control signal is driven to the voltage level based at least in part on an operation of the pull-down transistor.

In some examples, the control signal generator 630 may be configured as or otherwise support a means for driving, during a first duration, the control signal to the voltage in accordance with a first reference current based at least in part on the difference between the reference voltage and the voltage of the internal signal being below a threshold. In some examples, the control signal generator 630 may be configured as or otherwise support a means for driving, during a second duration after the first duration, the control signal to the voltage in accordance with a second reference current based at least in part on the difference between the reference voltage and the voltage of the internal signal being above the threshold, the second reference current being larger than the first reference current.

Figure 7:
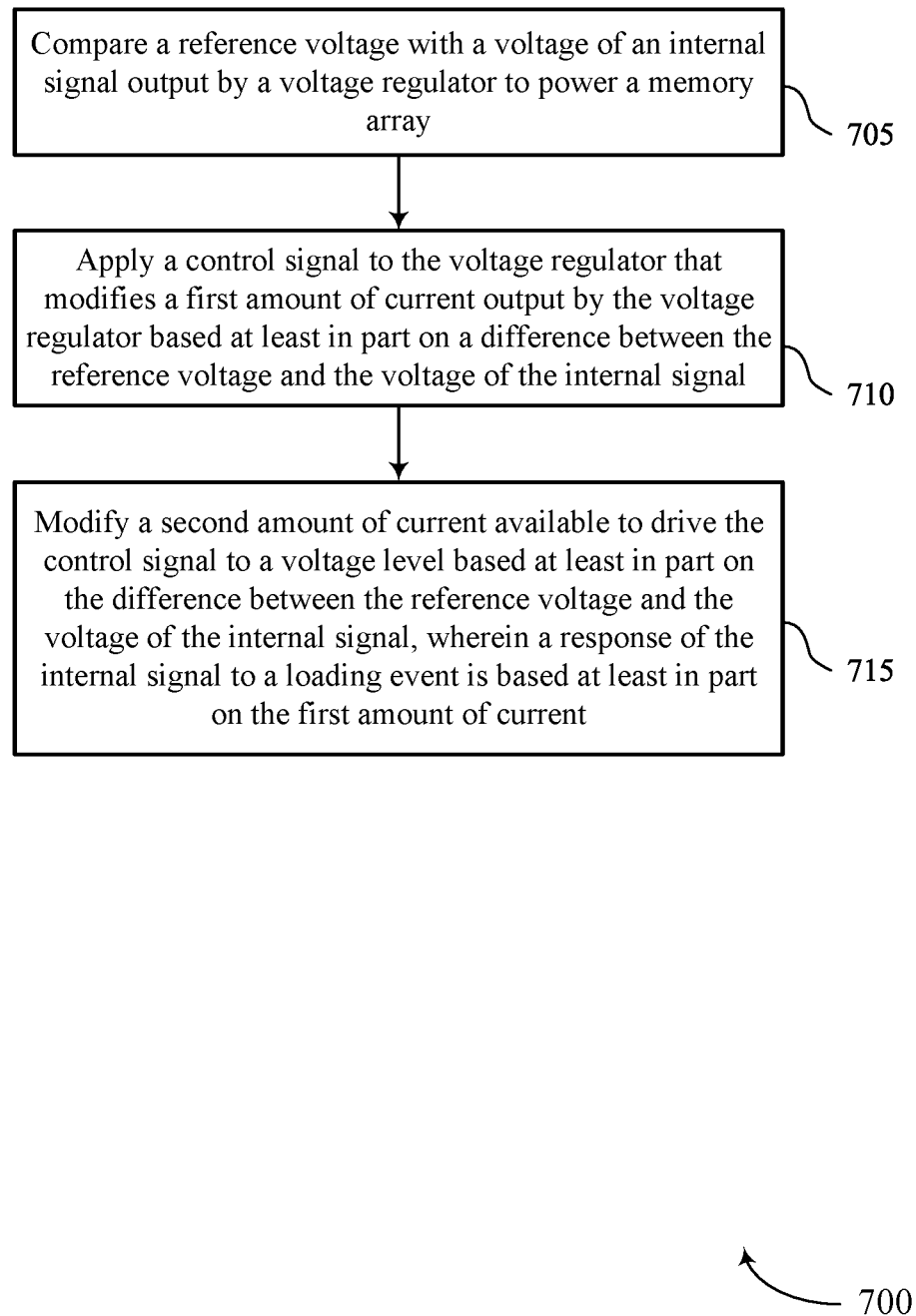
FIG. 7 shows a flowchart illustrating a method or methods that support operating an amplifier with a controllable pull-down capability in accordance with examples as disclosed herein.

FIG. 7 shows a flowchart illustrating a method 700 that supports operating an amplifier with a controllable pull-down capability in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include comparing a reference voltage with a voltage of an internal signal output by a voltage regulator to power a memory array. The operations of 705 may be performed in accordance with examples as disclosed herein. In some examples, aspects of the operations of 705 may be performed by a comparator 625 as described with reference to FIG. 6.

At 710, the method may include applying a control signal to the voltage regulator that modifies a first amount of current output by the voltage regulator based at least in part on a difference between the reference voltage and the voltage of the internal signal. The operations of 710 may be performed in accordance with examples as disclosed herein. In some examples, aspects of the operations of 710 may be performed by a control signal generator 630 as described with reference to FIG. 6.

At 715, the method may include modifying a second amount of current available to drive the control signal to a voltage level based at least in part on the difference between the reference voltage and the voltage of the internal signal, where a response of the internal signal to a loading event is based at least in part on the first amount of current. The operations of 715 may be performed in accordance with examples as disclosed herein. In some examples, aspects of the operations of 715 may be performed by a power source 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for comparing a reference voltage with a voltage of an internal signal output by a voltage regulator to power a memory array, applying a control signal to the voltage regulator that modifies a first amount of current output by the voltage regulator based at least in part on a difference between the reference voltage and the voltage of the internal signal, and modifying a second amount of current available to drive the control signal to a voltage level based at least in part on the difference between the reference voltage and the voltage of the internal signal, where a response of the internal signal to a loading event is based at least in part on the first amount of current.

In some examples of the method 700 and the apparatus described herein, modifying the second amount of the current may include operations, features, circuitry, logic, means, or instructions for increasing the amount of the current based at least in part on the difference between the reference voltage and the voltage of the internal signal satisfying a threshold.

Some examples of the method 700 and the apparatus described herein may further include operations, features, circuitry, logic, means, or instructions for increasing an upper limit of a reference current for a pull-down transistor that may be coupled with the voltage regulator based at least in part on the difference between the reference voltage and the voltage of the internal signal satisfying a threshold, where the amount of available current may be modified based at least in part on increasing the upper limit, and where the control signal may be driven to the voltage level based at least in part on an operation of the pull-down transistor.

Some examples of the method 700 and the apparatus described herein may further include operations, features, circuitry, logic, means, or instructions for driving, during a first duration, the control signal to the voltage in accordance with a first reference current based at least in part on the difference between the reference voltage and the voltage of the internal signal being below a threshold and driving, during a second duration after the first duration, the control signal to the voltage in accordance with a second reference current based at least in part on the difference between the reference voltage and the voltage of the internal signal being above the threshold, the second reference current being larger than the first reference current.

It should be noted that the methods described herein describe possible implementations, and that the operations and the steps may be rearranged or otherwise modified and that other implementations are possible. Further, portions from two or more of the methods may be combined.

An apparatus is described. The apparatus may include a memory array, an amplifier coupled with the memory array and configured to output, based at least in part on a difference between a first input signal and a second input signal, a control signal associated with generating an internal signal for the memory array, where the first input signal is based at least in part on an operating voltage of the memory array, a comparator coupled with the amplifier and configured to control a pull-down capability of the amplifier based at least in part on the difference between the first input signal and the second input signal, where the control signal is based at least in part on the pull-down capability of the amplifier, and a transistor coupled with the amplifier and configured to generate the internal signal based at least in part on the control signal.

In some examples of the apparatus, transistors of the comparator may be integrated with transistors of the amplifier and the amplifier includes a bias circuit configured to generate a bias current for the amplifier and the comparator.

In some examples of the apparatus, the amplifier includes a pull-down circuit configured to couple an output of the amplifier with a voltage source and a pull-down controller coupled with the pull-down circuit and configured to generate a reference current for the pull-down circuit of the amplifier and a pull-down circuit of the comparator, where the pull-down controller includes a first current generator controlled by the amplifier and a second current generator controlled by the comparator.

In some examples of the apparatus, the amplifier includes a pull-up circuit configured to couple the output of the amplifier with a second voltage source that may have a higher voltage than the voltage source and a pull-up controller coupled with the pull-up circuit and configured to control the pull-up circuit of the amplifier.

In some examples of the apparatus, the comparator may be configured to increase the pull-down capability of the amplifier when the difference between the first input signal and the second input signal satisfies a threshold.

Another apparatus is described. The apparatus may include a memory array including a conductive line configured to have an internal signal, a first voltage source configured to have a first voltage, a second voltage source configured to have a second voltage that is lower than the first voltage, and an amplifier coupled with the memory array, the first voltage source, and the second voltage source, the amplifier configured to control the internal signal for the memory array, the amplifier including a bias circuit configured to generate a current for biasing the amplifier, a differential input circuit coupled with the bias circuit and configured to compare a first input signal with a second input signal, a pull-down circuit coupled with the differential input circuit and configured to couple an output of the amplifier with the second voltage source, a comparator coupled with the bias circuit and configured to compare the first input signal and the second input signal, and a circuit coupled with the comparator and the pull-down circuit, the circuit configured to increase a pull-down capability of the pull-down circuit based at least in part on a difference between the first input signal and the second input signal.

In some examples, the apparatus includes a power circuit coupled with the pull-down circuit of the amplifier and configured to couple the conductive line with the first voltage source based at least in part on the pull-down capability of the pull-down circuit being increased, where the internal signal on the conductive line may be boosted based at least in part on coupling the conductive line with the first voltage source.

In some examples of the apparatus, the comparator includes a differential input circuit that may be coupled with the bias circuit, where the bias circuit may be further configured to generate the current for biasing the comparator, and where the circuit may be coupled with the differential input circuit of the comparator.

In some examples of the apparatus, the bias circuit includes a transistor, the differential input circuit of the amplifier includes a first transistor and a second transistor, a source of the first transistor of the differential input circuit of the amplifier being coupled with a source of the second transistor of the differential input circuit of the amplifier and a drain of the transistor of the bias circuit, and the differential input circuit of the comparator includes a first transistor and a second transistor, a source of the first transistor of the differential input circuit of the comparator being coupled with a source of the second transistor of the differential input circuit of the comparator and the drain of the transistor of the bias circuit.

In some examples of the apparatus, a size of the second transistor of the differential input circuit of the comparator may be larger than a size of the first transistor of the differential input circuit of the comparator.

In some examples of the apparatus, the comparator includes a pull-up circuit coupled with the differential input circuit of the comparator and the first voltage source, the pull-up circuit of the comparator configured to couple an output of the comparator with the first voltage source and a pull-down circuit coupled with the differential input circuit of the comparator, and the second voltage source, the pull-down circuit of the comparator configured to couple the output of the comparator with the second voltage source.

In some examples of the apparatus, the pull-up circuit of the comparator includes a transistor having a gate that may be coupled with a gate of a transistor of a pull-up circuit of the amplifier and the pull-down circuit of the comparator includes a transistor having a gate that may be coupled with a gate of a transistor of the pull-down circuit of the amplifier.

In some examples of the apparatus, the amplifier includes a pull-down controller coupled with the differential input circuit and the pull-down circuit, the pull-down controller configured to generate a first reference current for the pull-down circuit and the pull-down controller includes the circuit and may be configured to generate a second reference current for the pull-down circuit based at least in part on the difference between the first input signal and the second input signal, where the second reference current may be larger than the first reference current.

In some examples of the apparatus, the circuit may be configured to generate a supplemental reference current based at least in part on the difference between the first input signal and the second input signal, and the second reference current may be based at least in part on a summation of the first reference current and the supplemental reference current.

In some examples of the apparatus, the amplifier includes a buffer coupled with the comparator and the boost circuit, the buffer configured to apply a voltage of an output of the comparator to an input of the circuit while shielding the output of the comparator from the input of the boost circuit.

In some examples of the apparatus, the amplifier includes a pull-up circuit coupled with the differential input circuit and configured to couple the output of the amplifier with the first voltage source, where the differential input circuit may be configured to control the pull-up circuit.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    a memory array;
    an amplifier coupled with the memory array and configured to output, based at least in part on a difference between a first input signal and a second input signal, a control signal associated with generating an internal signal for the memory array, wherein the first input signal is based at least in part on an operating voltage of the memory array;
    a comparator coupled with the amplifier and configured to control a pull-down capability of the amplifier based at least in part on the difference between the first input signal and the second input signal, wherein the control signal is based at least in part on the pull-down capability of the amplifier; and
    a transistor coupled with the amplifier and configured to generate the internal signal based at least in part on the control signal.

2. The apparatus of claim 1, wherein:
    transistors of the comparator are integrated with transistors of the amplifier, and
    the amplifier comprises a bias circuit configured to generate a bias current for the amplifier and the comparator.

3. The apparatus of claim 1, wherein the amplifier comprises:
    a pull-down circuit configured to couple an output of the amplifier with a voltage source; and
    a pull-down controller coupled with the pull-down circuit and configured to generate a reference current for the pull-down circuit of the amplifier and a pull-down circuit of the comparator, wherein the pull-down controller comprises a first current generator controlled by the amplifier and a second current generator controlled by the comparator.

4. The apparatus of claim 3, wherein the amplifier comprises:
    a pull-up circuit configured to couple the output of the amplifier with a second voltage source that has a higher voltage than the voltage source; and
    a pull-up controller coupled with the pull-up circuit and configured to control the pull-up circuit of the amplifier.

5. The apparatus of claim 1, wherein the comparator is configured to increase the pull-down capability of the amplifier when the difference between the first input signal and the second input signal satisfies a threshold.

6. An apparatus, comprising:
a memory array comprising a conductive line configured to have an internal signal;
a first voltage source configured to have a first voltage;
a second voltage source configured to have a second voltage that is lower than the first voltage; and
an amplifier coupled with the memory array, the first voltage source, and the second voltage source, the amplifier configured to control the internal signal for the memory array, the amplifier comprising:
a bias circuit configured to generate a current for biasing the amplifier;
a differential input circuit coupled with the bias circuit and configured to compare a first input signal with a second input signal;
a pull-down circuit coupled with the differential input circuit and configured to couple an output of the amplifier with the second voltage source;
a comparator coupled with the bias circuit and configured to compare the first input signal and the second input signal; and
a circuit coupled with the comparator and the pull-down circuit, the circuit configured to increase a pull-down capability of the pull-down circuit based at least in part on a difference between the first input signal and the second input signal.

7. The apparatus of claim 6, further comprising:
a power circuit coupled with the pull-down circuit of the amplifier and configured to couple the conductive line with the first voltage source based at least in part on the pull-down capability of the pull-down circuit being increased, wherein the internal signal on the conductive line is boosted based at least in part on coupling the conductive line with the first voltage source.

8. The apparatus of claim 6, wherein the comparator comprises:
a differential input circuit that is coupled with the bias circuit, wherein the bias circuit is further configured to generate the current for biasing the comparator, and wherein the circuit is coupled with the differential input circuit of the comparator.

9. The apparatus of claim 8, wherein:
the bias circuit comprises a transistor,
the differential input circuit of the amplifier comprises a first transistor and a second transistor, a source of the first transistor of the differential input circuit of the amplifier being coupled with a source of the second transistor of the differential input circuit of the amplifier and a drain of the transistor of the bias circuit, and
the differential input circuit of the comparator comprises a first transistor and a second transistor, a source of the first transistor of the differential input circuit of the comparator being coupled with a source of the second transistor of the differential input circuit of the comparator and the drain of the transistor of the bias circuit.

10. The apparatus of claim 9, wherein a size of the second transistor of the differential input circuit of the comparator is larger than a size of the first transistor of the differential input circuit of the comparator.

11. The apparatus of claim 8, wherein the comparator comprises:
a pull-up circuit coupled with the differential input circuit of the comparator and the first voltage source, the pull-up circuit of the comparator configured to couple an output of the comparator with the first voltage source; and
a pull-down circuit coupled with the differential input circuit of the comparator, and the second voltage source, the pull-down circuit of the comparator configured to couple the output of the comparator with the second voltage source.

12. The apparatus of claim 11, wherein:
the pull-up circuit of the comparator comprises a transistor having a gate that is coupled with a gate of a transistor of a pull-up circuit of the amplifier, and
the pull-down circuit of the comparator comprises a transistor having a gate that is coupled with a gate of a transistor of the pull-down circuit of the amplifier.

13. The apparatus of claim 6, wherein:
the amplifier comprises a pull-down controller coupled with the differential input circuit and the pull-down circuit, the pull-down controller configured to generate a first reference current for the pull-down circuit, and
the pull-down controller comprises the circuit and is configured to generate a second reference current for the pull-down circuit based at least in part on the difference between the first input signal and the second input signal, wherein the second reference current is larger than the first reference current.

14. The apparatus of claim 13, wherein the circuit is configured to generate a supplemental reference current based at least in part on the difference between the first input signal and the second input signal, wherein the second reference current is based at least in part on a summation of the first reference current and the supplemental reference current.

15. The apparatus of claim 6, wherein the amplifier comprises:
a buffer coupled with the comparator and the circuit, the buffer configured to apply a voltage of an output of the comparator to an input of the circuit while shielding the output of the comparator from the input of the circuit.

16. The apparatus of claim 6, wherein the amplifier comprises:
a pull-up circuit coupled with the differential input circuit and configured to couple the output of the amplifier with the first voltage source, wherein the differential input circuit is configured to control the pull-up circuit.

17. A method, comprising:
comparing a reference voltage with a voltage of an internal signal output by a voltage regulator to power a memory array;
applying a control signal to the voltage regulator that modifies a first amount of current output by the voltage regulator based at least in part on a difference between the reference voltage and the voltage of the internal signal; and
decreasing a second amount of current available to drive the control signal to a voltage level based at least in part on the difference between the reference voltage and the voltage of the internal signal satisfying a threshold, wherein a response of the internal signal to a loading event is based at least in part on the first amount of current.

18. A method, comprising:
comparing a reference voltage with a voltage of an internal signal output by a voltage regulator to power a memory array;
applying a control signal to the voltage regulator that modifies a first amount of current output by the voltage regulator based at least in part on a difference between the reference voltage and the voltage of the internal signal; and increasing a second amount of current available to drive the control signal to a voltage level based at least in part on the difference between the reference voltage and the voltage of the internal signal satisfying a threshold, wherein a response of the internal signal to a loading event is based at least in part on the first amount of current.

19. A method, comprising:

comparing a reference voltage with a voltage of an internal signal output by a voltage regulator to power a memory array;

applying a control signal to the voltage regulator that modifies a first amount of current output by the voltage regulator based at least in part on a difference between the reference voltage and the voltage of the internal signal; and increasing an upper limit of a reference current for a pull-down transistor that is coupled with the voltage regulator based at least in part on the difference between the reference voltage and the voltage of the internal signal satisfying a threshold, wherein a second amount of current available to drive the control signal to a voltage level is modified based at least in part on increasing the upper limit, wherein a response of the internal signal to a loading event is based at least in part on the first amount of current, and wherein the control signal is driven to the voltage level based at least in part on an operation of the pull-down transistor.

20. A method, comprising:

comparing a reference voltage with a voltage of an internal signal output by a voltage regulator to power a memory array;

applying a control signal to the voltage regulator that modifies a first amount of current output by the voltage regulator based at least in part on a difference between the reference voltage and the voltage of the internal signal;

modifying a second amount of current available to drive the control signal to a voltage level based at least in part on the difference between the reference voltage and the voltage of the internal signal, wherein a response of the internal signal to a loading event is based at least in part on the first amount of current;

driving, during a first duration and based at least in part on the modifying, the control signal to the voltage in accordance with a first reference current based at least in part on the difference between the reference voltage and the voltage of the internal signal being less than or equal to a threshold; and driving, during a second duration after the first duration and based at least in part on the modifying, the control signal to the voltage in accordance with a second reference current based at least in part on the difference between the reference voltage and the voltage of the internal signal being greater than the threshold, the second reference current being larger than the first reference current.

* * * * *